United States Patent
Murakami et al.

(10) Patent No.: US 6,525,356 B1
(45) Date of Patent: Feb. 25, 2003

(54) SOLID IMAGING DEVICE (75) Inventors: Ichiro Murakami, Tokyo (JP); Yasutaka Nakashiba, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/458,697

(22) Filed: Dec. 13, 1999

(30) Foreign Application Priority Data

Dec. 15, 1998 (JP) ............................................. 10-356663

(51) Int. Cl.$^7$ ..................... H01L 31/062; H01L 31/113; H01L 31/0203; H01L 31/0232
(52) U.S. Cl. ........................ 257/294; 257/434; 257/435
(58) Field of Search .......................... 257/146, 87, 435, 257/257, 434, 436, 437

(56) References Cited

U.S. PATENT DOCUMENTS

| | | |
|---|---|---|
| 4,929,994 A | 5/1990 | Matsumoto |
| 5,483,090 A | 1/1996 | Kitamura et al. |
| 5,585,653 A * | 12/1996 | Nakashiba .................. 257/232 |
| 5,773,848 A * | 6/1998 | Wu et al. ...................... 257/72 |
| 5,773,859 A * | 6/1998 | Ueno .......................... 257/291 |
| 5,831,321 A * | 11/1998 | Nagayama .................. 257/412 |
| 6,054,336 A * | 4/2000 | Peck et al. ..................... 438/60 |
| 6,246,081 B1 * | 6/2001 | Abe ............................. 257/294 |

FOREIGN PATENT DOCUMENTS

| | | |
|---|---|---|
| JP | 63-269567 A | 11/1988 |
| JP | 6-296008 A | 10/1994 |
| JP | 6-296009 A | 10/1994 |
| JP | 11-150262 A | 6/1999 |

* cited by examiner

*Primary Examiner*—Carl Whitehead, Jr.
*Assistant Examiner*—Kiesha Rose
(74) *Attorney, Agent, or Firm*—Foley & Lardner (57) ABSTRACT

A frame transfer-type solid imaging device is provided, which can be operated without reducing the transfer efficiency or the transfer charge quantity.

A plurality of N-type regions 5 constituting photoelectric conversion regions and a plurality of P$^+$-type regions 6 constituting channel stop regions are formed on a P-type silicon substrate 4, and a transparent electrode 1 is further formed through an insulating film 7 on the substrate 4. The thickness of the transparent electrode at a portion above the photoelectric conversion region is made thinner than the thickness of the other part of the transparent electrode 1, and an antireflection film 8 is formed above the photoelectric conversion region 2.

24 Claims, 4 Drawing Sheets

2: PHOTOELECTRIC CONVENSION REGION

2: PHOTOELECTRIC CONVENSION REGION

3: CHANNEL STOP REGION

2: PHOTOELECTRIC CONVENSION REGION

3: CHANNEL STOP REGION

2: PHOTOELECTRIC CONVENSION REGION

51: PHOTOELECTRIC CONVENSION REGION
51: PHOTOELECTRIC CONVENSION REGION
53: CHANNEL STOP REGION

SOLID IMAGING DEVICE

BACKGROUND OF THE INVENTION

1. Field of the Invention

The present invention relates to a solid imaging device and a method of manufacturing the same, and particularly relates to a frame transfer or a full frame transfer-type solid imaging device, which is provided with the improved sensitivity and resolution without reducing the transfer efficiency or the transfer charge.

2. Background Art

When CCD type solid imaging devices are classified by their operation mode, there are two systems: one is an interline transfer system and another one is a frame transfer system (or a full-frame transfer system). In the solid imaging device operated by the interline transfer system, each pixel is constructed by a PN junction, and light is incident on the N-type region through the insulating film formed on the region. A vertical CCD resistor is formed adjacent to each pixel in sequence, and the signal charge accumulated on the light receiving portion is transferred to the vertical CCD resistor. The content of the vertical resistor is transferred and output to the horizontal CCD resistor. In contrast, in the frame transfer-type solid imaging device, the CCD is divided into the light receiving portion and the charge storing portion, the signal charge accumulated in the light receiving portion is transferred to the charge storing portion, and the signal charge stored in the charge storing portion is output to the horizontal CCD resistor. In the case of the frame transfer, the transfer of signals is carried out during unoccupied time, and the light receiving portion stores the next signal charge, during the reading period. Therefore, in some cases, as the light receiving portion in the frame transfer type solid imaging device, the other type of CCD is used in which light is admitted through the transparent electrode forming a transfer gate and the photoelectric conversion is conducted at the PN junction below the transfer gate.

The solid imaging device of the full-frame transfer system comprises a light receiving cell array and a horizontal transfer portion, and when the accumulated charge is transferred to the horizontal transfer portion it is necessary to intercept incident light by means of a shutter such as a mechanical shutter. Since the frame transfer type solid imaging device comprises the light receiving cell array portion, the storing portion and a horizontal transfer portion, the charge accumulated in the storing portion is collectively transferred to the storing portion at high speed. Furthermore, since the storing portion is shaded, transfer of the image information stored in the storing portion can be completed by the time the next image information is accumulated in the light receiving portion, it is not necessary to provide a shutter, such as a mechanical shutter, for intercepting the incident light.

Figure 7:
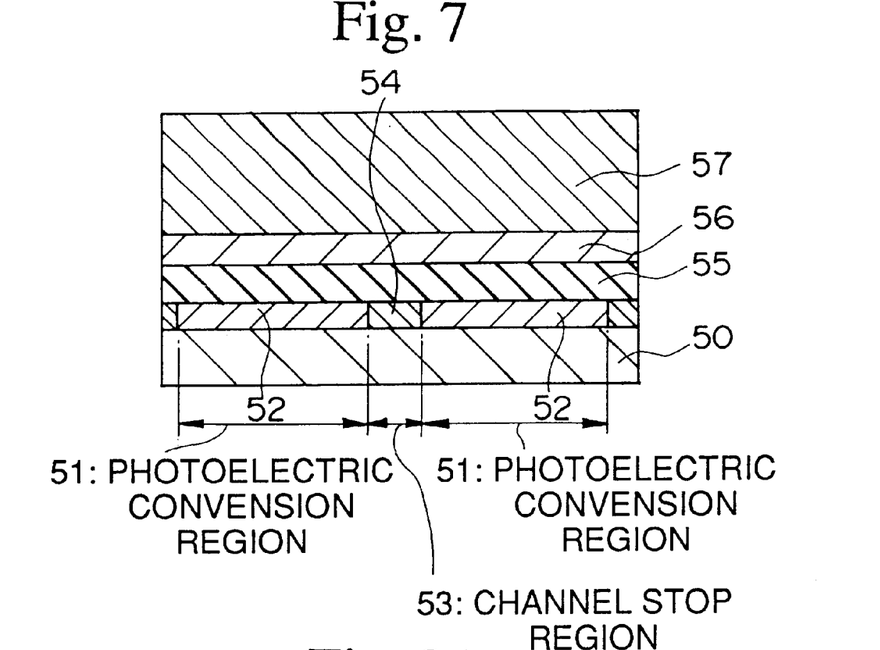
FIG. 7 is a cross-sectional diagram showing a structure of a conventional CCD-type solid imaging device operated by the frame transfer system.

FIG. 7 is a cross-sectional diagram showing a structural example of conventional frame transfer type solid imaging devices. The diagram shown in FIG. 7 illustrates the cross-section of the solid imaging device along the longitudinal direction of the transparent electrode. This solid imaging device comprises, on the P-type silicon substrate, an N-type region 52 corresponding to a photoelectric conversion region 51, and a P+-type region 54 corresponding to a channel stop region 53, which separates the adjacent photoelectric regions from each other. Furthermore, a transparent film 56 is formed through an insulating layer 55 on the substrate 50, and a flattening layer 57 is formed on the transparent film 56.

Figure 8A:
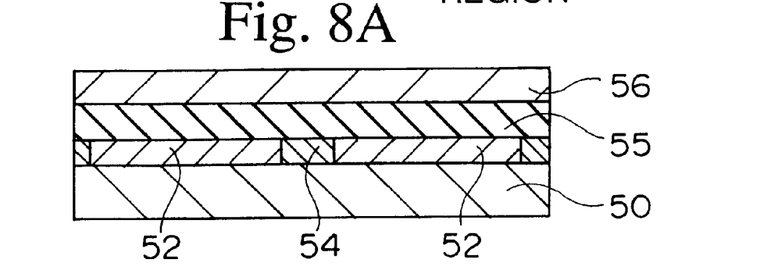
FIGS. 8A and 8B are cross-sectional diagrams showing the manufacturing process of the conventional CCD-type solid imaging device shown in FIG. 7.
Figure 8B:
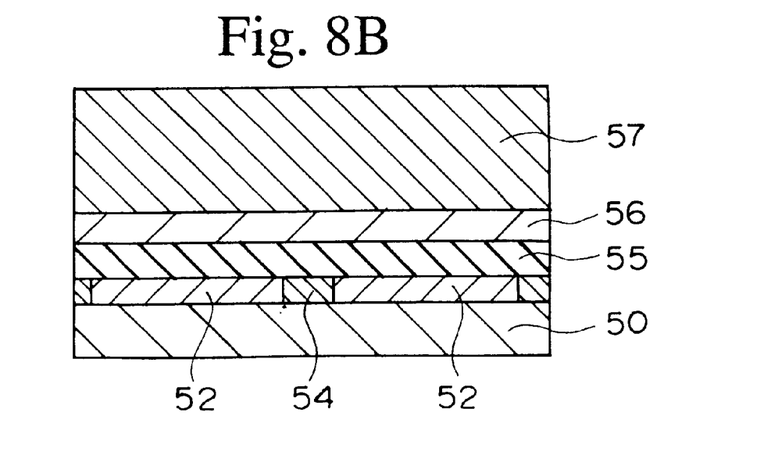

A manufacturing process of the solid imaging device having the above construction will be described. First, as shown in FIG. 8(a), the N-type region 52 and the P+-type region 54 are formed on the P-type silicon substrate 50, the insulating layer 55 and a polycrystalline silicon film are formed in sequence, and an elongated transparent electrode 56 is then formed by patterning the polycrystalline silicon. Subsequently, as shown in FIG. 8(b), a flattening layer 57 made of silicon oxide is formed so as to cover the transparent electrode 56.

In this solid imaging device, light is incident to the P-type silicon substrate through the flattening layer, the transparent electrode 57, and the insulating layer 55, and after photoelectric conversion is carried out in the N-type region 51 of the photoelectric conversion region 51, the signal charge is stored. The stored signal charges are transferred sequentially by applying pulses to a plurality of transparent electrodes 56.

However, several problems have been encountered in the conventional solid imaging device: the sensitivity is reduced when the transparent film is thick, and the transfer efficiency and the quantity of the transfer charge are reduced when the transparent film is thin. The resolution of the conventional imaging device is also not satisfactory.

The problems are caused by the following factors. In the conventional imaging device, the transparent electrode made of silicon and the like is formed at an uniform thickness, and one of the measures to reduce the wiring resistance around the transparent electrode is to increase the thickness of the transparent film. However, when the thickness of the transparent film is increased, a part of the light incident to the transparent film is diffused, and the transparency of the transparent electrode decreases so that the sensitivity of the imaging device is reduced. If the thin transparent electrode is used in order to increase the sensitivity, the wiring resistance increases, which results in causing a problem of the pulse rounding, and in decreasing the transfer efficiency and the transfer charge quantity. Furthermore, when the structure shown in FIG. 7 is considered, light incident to the periphery of the channel stop region through the transparent electrode is distributed to both of the photoelectric conversion regions of the channel stop region to cause photoelectric conversion, which results in the reduction of the resolution of the imaging device.

SUMMARY OF THE INVENTION

It is therefore an object of the present invention to provide a frame transfer-type or a full frame transfer-type solid imaging device and method of manufacturing the same, which is superior in sensitivity or resolution without reducing the transfer efficiency or the transfer charge quantity.

According to the first aspect of the present invention, the solid imaging device, which corresponds to a frame transfer-type or full-frame transfer-type solid imaging device, comprising: a plurality of photoelectric conversion regions and a plurality of channel stop regions for separating each photoelectric conversion region are arranged on a semiconductor substrate; and transparent electroded, which are formed above said plurality of photoelectric conversion regions and said plurality of channel stop regions formed through a first insulating film; wherein said solid imaging device further comprises an antireflection film formed on at least a part of said transparent electrodes located above said photoelectric conversion region.

According to the second aspect, the solid imaging device which corresponds to a frame transfer-type or full-frame transfer-type solid imaging device, comprising: a plurality of photoelectric conversion regions and a plurality of channel stop regions for separating each photoelectric conversion region are arranged on a semiconductor substrate; and transparent electrodes formed through a first insulating film above said plurality of photoelectric conversion regions and said plurality of channel stop regions; wherein, said solid imaging device comprises an antireflection film, having an intermediate refractive index in between two refractive indices of said transparent electrode and a second insulating film formed so as to cover said transparent electrodes, forming at an interface between at least a part of said transparent electrodes located above said photoelectric conversion region and a second insulating film covering said transparent film.

It is preferable that the thickness of a part of said transparent electrode above said photoelectric conversion region be formed so as to be thinner than that of the other area of said transparent electrode. And it is also preferable that a light shielding film is formed on said transparent electrode excluding an area above said photoelectric conversion region.

According to the third aspect, the solid imaging device, which corresponds to a frame transfer-type or full-frame transfer-type solid imaging device, comprising: a plurality of photoelectric conversion regions and a plurality of channel stop regions for separating each photoelectric conversion region are arranged on a semiconductor substrate; and transparent electrodes, which are formed above said plurality of photoelectric conversion regions and said plurality of channel stop regions formed through an insulating film; wherein the solid imaging device further comprises: a light shielding film formed on the surface of said transparent electrode excluding the surface above said photoelectric conversion region.

According to the fourth aspect, the solid imaging device which corresponds to a frame transfer-type or full-frame transfer-type solid imaging device, comprising: a plurality of photoelectric conversion regions and a plurality of channel stop regions for separating each photoelectric conversion region arranged on a semiconductor substrate; and transparent electrodes formed through a first insulating film above said plurality of photoelectric conversion regions and said plurality of channel stop regions; wherein the thickness of said transparent electrode above said photoelectric conversion region is formed so as to be thinner than that of the other area of said transparent electrode.

According to the solid imaging device of the present invention, since an antireflection is disposed on a part of the surface of the transparent electrode located at a position above the photoelectric conversion region, the quantity of light arriving to the photoelectric conversion region through the transparent electrode and the insulating film increases; that is, the transmission increases. As a result, the sensitivity is improved. Furthermore, it is possible to prevent total reflection of light when an antireflection film having an intermediate refractive index between that of the transparent electrode and the second insulating film is used.

In addition to adopting the antireflection film, when a part of the transparent electrode corresponding to the photoelectric conversion region is made thinner than the other part, the light transmission increases, which results in improving the sensitivity. In other words, since the portion of the thickness of the transparent electrode excluding the area corresponding to the photoelectric conversion region is thick in the present invention, the wiring resistance can be reduced when compared to the conventional device, in which the transparent electrode is formed into a uniformly thin film for the sake of transmission. Consequently, it is possible to prevent the read pulse from rounding and to prevent reduction of the transfer efficiency and the transfer charge quantity. In this case, it is necessary to reduce the thickness of the transparent electrode corresponding to the photoelectric conversion region to less than 300 nm, and it is preferable that the thickness is in a range of 150 to 200 nm. If too thick, the low transmission degrades the sensitivity. There is a proportional relationship between the film thickness and the area of the light receiving cell, and if the cell area is constant, the sensitivity increases with decreasing thickness, and if the sensitivity is constant, the cell area may decrease.

When a light shielding film is formed on, for example, the channel stop regions, the light incident to the channel stop regions is shielded. Thus, the resolution of the device is improved because the light incident to a photoelectric conversion region is prevented from being incident to the adjacent photoelectric conversion region.

Practical examples of material used to manufacture the solid imaging device includes silicon for the semiconductor substrate; silicon oxide, silicon nitride, or silicon oxynitride for the (first) insulating film; polycrystalline silicon for the transparent electrode; silicon nitride or silicon oxynitride for the antireflection film; silicon oxide for the (second) insulating film; silicides of high melting point metals such as titanuim silicide or tungsten silicide or other metals for the light shielding film. For example, when polycrystalline silicon is used for the transparent electrode, silicon nitride or silicon oxynitride is used for the antireflection film, and silicon oxide is used for the second insulating film, a combination of the refractive indices of these layers from the bottom is formed as approximately 5, approximately 2, and about 1.45, which satisfy the condition for preventing total reflection.

A method of manufacturing a solid imaging device comprising the steps of: forming a plurality of a photoelectric conversion region by converting a part of a surface of a semiconductor substrate having the first conduction type into a region having a second conduction type, which is an opposite conduction type to said first conduction type, by ion implantation; forming a plurality of channel stop regions having a first conduction type which separates said plurality of photoelectric conversion regions; forming an insulating film on said semiconductor substrate; forming a transparent electrode on said insulating film; and forming an antireflection film having a refractive index smaller than that of the transparent film on a part or the whole of the surface of said transparent electrode. In the manufacturing step of forming said antireflection film, it is preferable to form the antireflection film on an area of said transparent electrode located above said photoelectric conversion region.

The other method of manufacturing a solid imaging device comprising the steps of: forming a plurality of photoelectric conversion regions by converting a part of a surface of a semiconductor substrate having the first conduction type into a region having a second conduction type, which is an opposite conduction type to said first conduction type, by ion implantation; forming a plurality of channel stop regions having a first conduction type which separates said plurality of photoelectric conversion region; forming an insulating film on said semiconductor substrate; forming a transparent electrode on said insulating film; and removing a transparent electrode above said photoelectric conversion region such that the thickness of a part or the whole of said transparent electrode above said photoelectric conversion region is thinner than that of the other area of said transparent electrode. The method further comprises the step of: subsequent to the step of removing a transparent electrode above said photoelectric conversion region such that the thickness of a part or the whole of said transparent electrode above said photoelectric conversion region is made thinner than that of the other area of said transparent electrode; and forming an antireflection film having a refractive index smaller than that of said transparent electrode on a part or the whole of the surface of said transparent electrode.

The still other method of manufacturing a solid imaging device comprising the steps of: forming a plurality of photoelectric conversion regions by converting a part of a surface of a semiconductor substrate having the first conduction type into a region having a second conduction type, which is an opposite conduction type to said first conduction type, by ion implantation; forming a plurality of channel stop regions having a first conduction type which separates said plurality of photoelectric conversion regions; forming an insulating film on said semiconductor substrate; forming a transparent electrode made of polycrystalline silicon on said insulating film; depositing a high melting point metal film on said transparent electrode; forming silicide of said high melting point metal at a portion where the high melting point metal is in contact with said transparent electrode by heat treatment; and removing said high melting point metal film which is not converted into silicide.

The further still other method of manufacturing a solid imaging device comprising the steps of: forming a plurality of a photoelectric conversion regions by converting a part of a surface of a semiconductor substrate having the first conduction type into a region having a second conduction type, which is an opposite conduction type to said first conduction type, by ion implantation; forming a plurality of a channel stop regions having a first conduction type which separates said plurality of photoelectric conversion regions; forming an insulating film on said semiconductor substrate; forming a transparent electrode made of polycrystalline silicon on said insulating film; depositing a high melting point metal film on said transparent electrode; forming silicide of said high melting point metal at a portion where the high melting point metal is in contact with said transparent electrode by heat treatment; and removing said high melting point metal film or the silicide located above said photoelectric conversion region. The method may further comprise the step of: after forming the antireflection film, forming a high melting point metal film on said transparent electrode; forming a silicide of said high melting point metal at a portion where the high melting point metal is in contact with said transparent electrode by heat treatment; and removing said high melting point metal film which is not converted into silicide. The method may further comprise the step of: after forming the antireflection film; forming a high melting point metal film on said transparent electrode; forming a silicide layer of said high melting point metal at a portion where the high melting point metal is in contact with said transparent electrode by heat treatment; and removing said high melting point metal film or the silicide layer located above said photoelectric conversion region.

The still further method of manufacturing a solid imaging device comprises the steps of: forming a plurality of a photoelectric conversion regions by converting a part of a surface of a semiconductor substrate having the first conduction type into a region having a second conduction type, which is an opposite conduction type to said first conduction type, by ion implantation; forming a plurality of a channel stop regions having a first conduction type which separates said plurality of photoelectric conversion regions; forming an insulating film on said semiconductor substrate; forming a transparent electrode made of polycrystalline silicon on said insulating film; forming a high melting point metal film on said transparent electrode; forming a silicide layer of said high melting point metal at a portion where the high melting point metal is in contact with said transparent electrode by heat treatment; removing said high melting point metal film or the silicide layer located above said photoelectric conversion region; and forming an antireflection film having a refractive index smaller than that of the transparent film on the surface of said transparent electrode located above said photoelectric conversion region.

A method of manufacturing a solid imaging device comprising the steps of: forming a plurality of a photoelectric conversion regions by converting a part of a surface of a semiconductor substrate having the first conduction type into a region having a second conduction type, which is an opposite conduction type to said first conduction type, by ion implantation; forming a plurality of a channel stop regions having a first conduction type which separates said plurality of photoelectric conversion regions; forming an insulating film on said semiconductor substrate; forming a transparent electrode made of polycrystalline silicon on said insulating film; depositing a metal film on said transparent electrode; and removing said metal film located above said photoelectric conversion region. The method further comprises the steps of: after forming the antireflection film, depositing a metal film on the surface of said transparent electrode; and removing the metal film located above said photoelectric conversion region. The method further comprises the steps of: after forming the antireflection film, forming an antireflection film having a refractive index smaller than that of the transparent film on the surface of said transparent electrode located above said photoelectric conversion region.

By the use of the manufacturing method of the present invention, it is possible to manufacture the solid imaging device which is superior in sensitivity or the resolution without reducing the transfer efficiency and the transfer charge quantity. When a solid imaging device is manufactured, which comprises features of (1) having a thin part of the transparent film formed above the photoelectric conversion region, (2) having a antireflection film formed on the transparent electrode above the photoelectric conversion region, and (3) having a light shielding film formed on the transparent electrode excluding the area above the photoelectric conversion region, these features can be manufactured in sequence in the order (1), (2) and (3). The order can be changed to the order (1), (3) and (2).

The light shielding film can be manufactured by forming first a high melting point metal film on the transparent electrode made of polycrystalline silicon, and then converting the high melting point metal into the silicide by heat treatment, and by removing the silicide of the high melting point metal on an area of the transparent electrode above the photoelectric conversion region. It is possible, on the other hand, to manufacture the light shielding film made of a metal film by depositing a metal film on the transparent electrode and removing the metal film located on the area above the photoelectric conversion region.

DETAILED DESCRIPTION OF THE INVENTION

First Embodiment

Hereinafter, the first embodiment of the present invention is described with reference to FIGS. 1 to 4.

Figure 1:
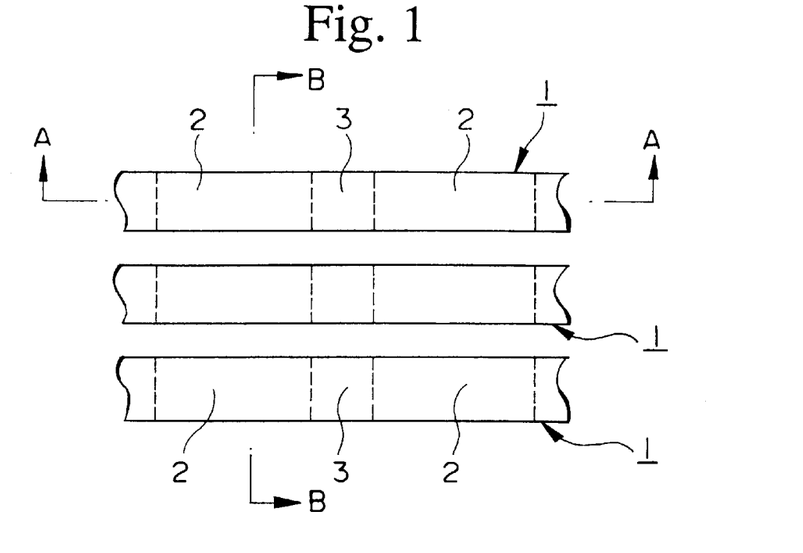
FIG. 1 is a planar view showing a structure of a CCD type solid imaging device according to the first embodiment of the present invention.
Figure 2:
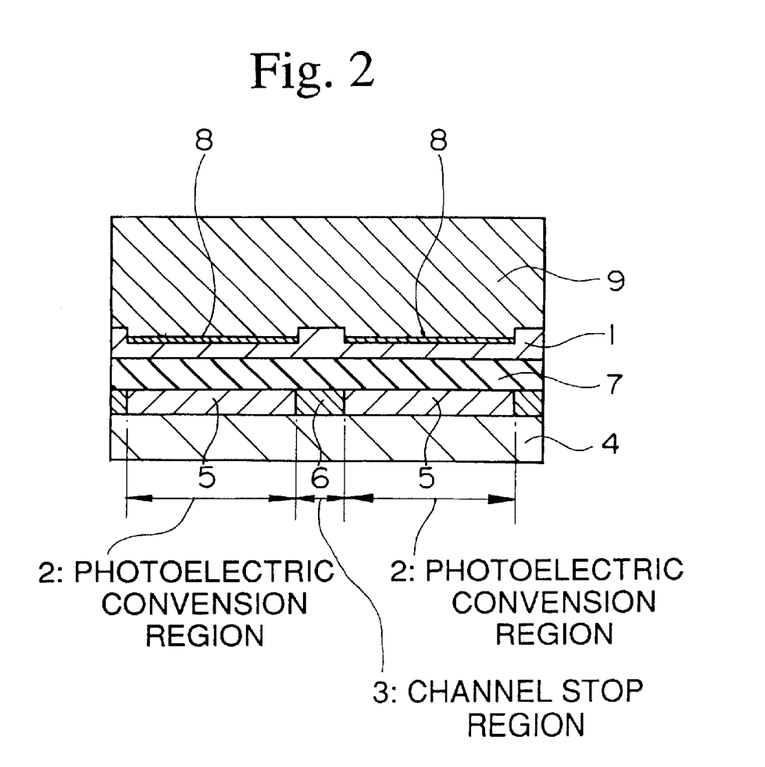
FIG. 2 shows a cross-sectional diagram along line A—A in FIG. 1.
Figure 3:
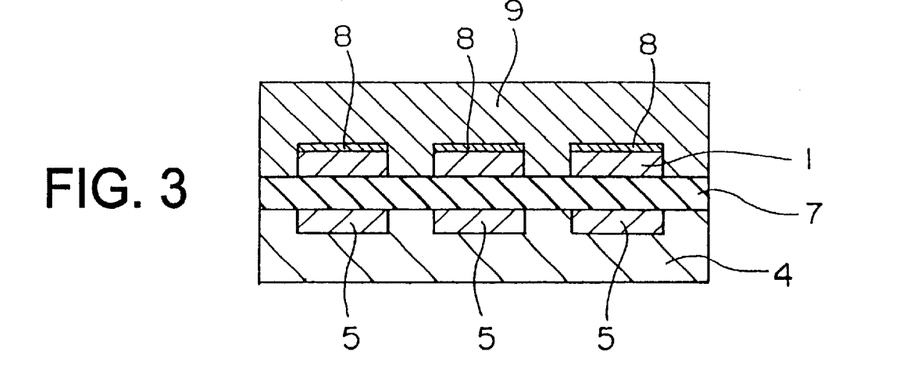
FIG. 3 shows a cross-sectional diagram along line B—B in FIG. 1.

FIG. 1 is a planar view showing a structure, in particular to a structure of the light receiving portion of a CCD type solid imaging device according to the first embodiment of the present invention. FIG. 2 shows a cross-sectional diagram (along line A—A in FIG. 1), FIG. 3 shows a cross-sectional diagram (along line B—B in FIG. 1), and FIGS. 4A to 4D are cross-sectional diagrams showing the manufacturing process of the CCD type solid imaging device according to the first embodiment of the present invention.

As shown in FIG. 1, the light receiving portion of the CCD-type imaging device of the present invention comprises a plurality of transparent electrodes 1 extending to the lateral direction, a plurality of photoelectric conversion regions 2 along each transparent electrode, and a plurality of channel stop regions 3, each of which separates respective two photoelectric conversion regions 2.

As shown in FIG. 2, the cross-sectional structure of the imaging device comprises an N-type region 5 doped with an N-type impurity formed on a P-type silicon substrate 4, and the N-type region 5 constitutes the photoelectric conversion region 2. The $P^+$-type regions 6 are formed as the channel stop region 3, which contains a higher concentration of P-type dopant than the concentration in the substrate 4 and which is disposed between two neighboring N-type regions 5 along the transparent electrode 1. The transparent electrodes 1 are formed on the substrate 4 through an insulating layer (the first insulating layer).

The film thickness of the transparent electrode 1 for the photoelectric conversion region 2 is made thinner than that of the transparent electrode for the channel stop region 3 and a antireflection film 8 is formed on the thin transparent electrode above the photoelectric conversion region 2. Furthermore, a flattening layer 9 (the second insulating layer) is formed so as to cover the transparent electrode 1 and the antireflection coating 8.

In the first embodiment, each of the components are made of various materials such as silicon oxide film for the insulating layer 7, polycrystalline silicon for the transparent electrode 1, silicon nitride (SiN) or silicon oxynitride (SiON) film for the antireflection film 8, and silicon oxide film for the flattening layer 9. The refractive indices of the transparent electrode 1, the antireflection film 8, and the flattening layer 9 are approximately 5, approximately 2 and 1.45 in sequence.

Hereinafter, an example of the manufacturing process of the above CCD-type solid imaging device is described with reference to FIGS. 4A to 4D. FIGS. 4A to 4D are cross-sectional diagrams showing from the same side as that of FIG. 2.

Figure 4A:
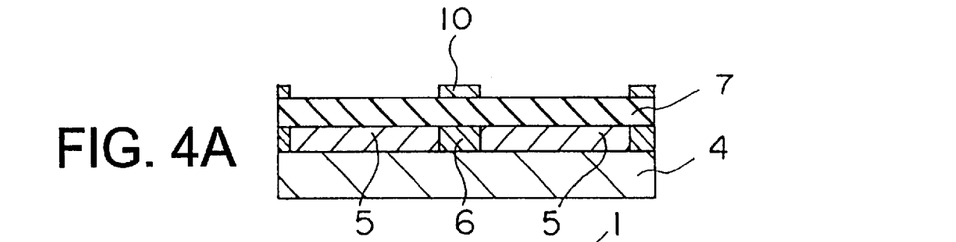
FIGS. 4A to 4D are cross-sectional diagrams showing the manufacturing process of the CCD type solid imaging device according to the first embodiment of the present invention.

As shown in FIG. 4A, on the surface of the P-type silicon substrate 4, the N-type region 5 and the $P^+$-type region 6 are formed as the photoelectric conversion region 2 and as the channel stop region 3, respectively. Subsequently, after depositing the silicon oxide film over the entire surface to form the insulating layer 7, a polycrystalline silicon film corresponding to a part of the transparent electrode is formed over the entire surface of the insulating layer 7 at a thickness in a range of 300 to 600 nm. The polycrystalline silicon film is subjected to a patterning process so as to remove a part of the polycrystalline silicon film corresponding to the photoelectric conversion region and to leave the other part of the polysilicon film excluding the photoelectric conversion region (corresponding to the region denoted by the numeral 10). Although it is preferable to form a thick polycrystalline silicon film, the appropriate film thickness of the polycrystalline silicon film left excluding the photoelectric conversion region is generally in the range of 300 to 600 nm, because, if the polycrystalline silicon film is thicker than 800 nm, sometimes the shape of the side walls of the film causes trouble.

Figure 4B:
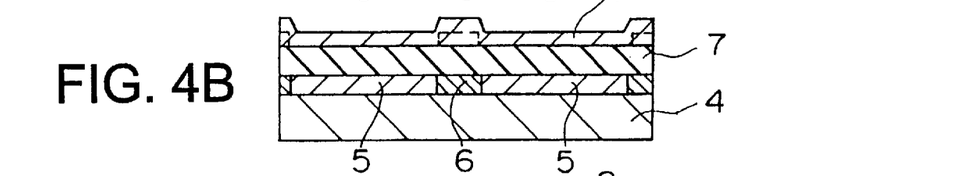

Subsequently, as shown in FIG. 4B, the transparent electrode 1 is formed by depositing a polycrystalline silicon layer having a step is formed over the entire surface at a thickness of 200 nm so as to obtain a thick film as a whole excluding a part of the thin film on the photoelectric conversion region.

Figures 4C, 4D:
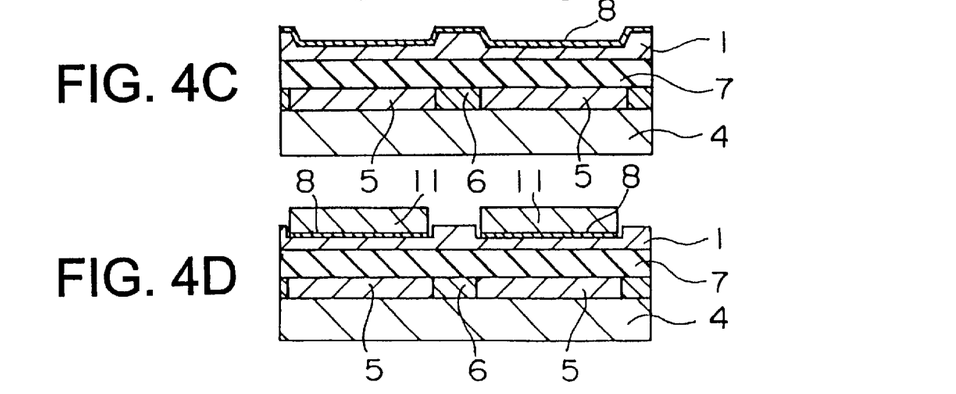

Subsequently, as shown in FIG. 4C, the antireflection film 8 is formed by depositing, for example, a silicon nitride film at a thickness of 50 nm by means of a CVD method or the like.

Subsequently, as shown in FIG. 4D, after forming the resist pattern 11 on the specified area of the antireflection film 8 (silicon nitride film) above the photoelectric conversion region, the silicon nitride film excluding the photoelectric conversion region is removed by performing etching of the silicon nitride film, using the resist pattern as a mask. Thereby, the antireflection film is left on an area corresponding to the photoelectric conversion regions 2 of the transparent electrodes 1.

Finally, after removing the resist pattern 11, the silicon oxide film is deposited to form the flattening layer 9 over the entire surface and the CCD type solid imaging device of the first embodiment is obtained.

In the CCD-type solid imaging device of the present embodiment, since the antireflection film 8 is formed on the specified surface of the transparent electrode 1 corresponding to the photoelectric conversion region 2, transmission of the light incident to the photoelectric conversion region becomes higher than that of the conventional device which does not include the antireflection film. Thereby, the sensitivity of the present device is improved. Since the polycrystalline silicon is used for the transparent electrode 1, the silicon nitride film or the silicon oxynitride film is used for the antireflection film 8, and the silicon oxide film is used for the flattening film 9, the refractive indices of those films are arranged from the bottom at approximately 5, approximately 2, and 1.45; the total reflection at the interfaces of each layer is reliably prevented, and the transmittance is improved.

In addition to the above effect, since a part of the transparent electrode corresponding to the photoelectric conversion region 2 is made thinner than the other part of the transparent electrode, the diffusion of light is prevented, which results in the transmittance of the incident light and the sensitivity of the solid imaging device being improved.

Furthermore, in the present embodiment, since the transparent electrode excluding the photoelectric conversion region 2 is formed thicker than that of the conventional transparent electrode film, in which the film is made uniform and thin over the entire surface, the wiring resistance can be reduced. As a result, it is possible to prevent generation of the pulse rounding and reduction of the transfer efficiency and the transfer charge.

As described above, in order to fabricate the thinner part of the transparent electrode 1 on the surface corresponding to the photoelectric conversion region 2, the manufacturing process of the present invention carries out the steps of, after forming the patterned film of the polycrystalline silicon over the entire surface except the photoelectric conversion region, the polycrystalline silicon film is re-deposited over the entire surface area. In place of the above method, it is also possible to use a method of first applying a thick polycrystalline silicon over the entire surface and then forming the thin polycrystalline silicon film by removing a part of the film corresponding to the photoelectric conversion region.

Second Embodiment

Hereinafter, the second embodiment of the present invention is described with reference to FIGS. 5 and 6A to 6D.

Figure 5:
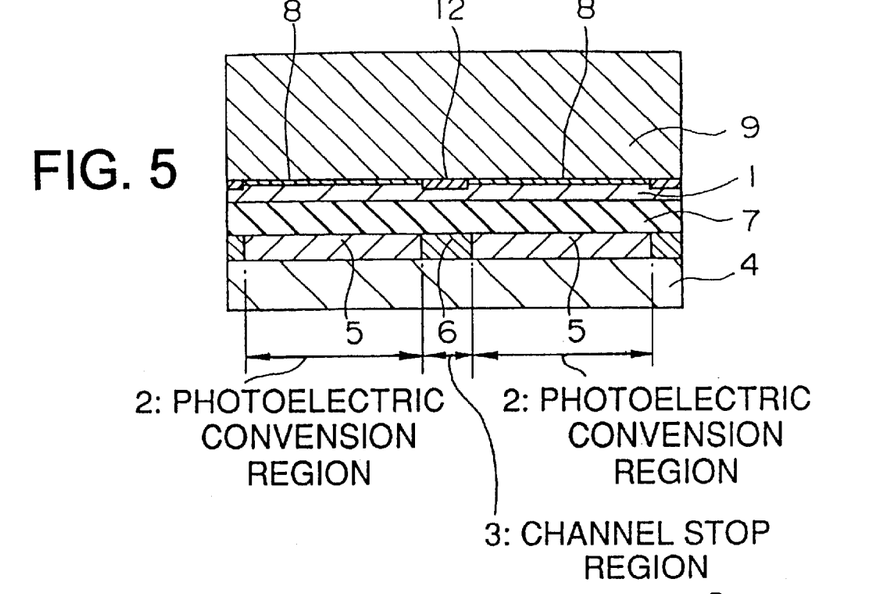
FIG. 5 is a cross-sectional diagram showing the CCD type solid imaging device according to the second embodiment of the present invention.
Figures 6A, 6B:
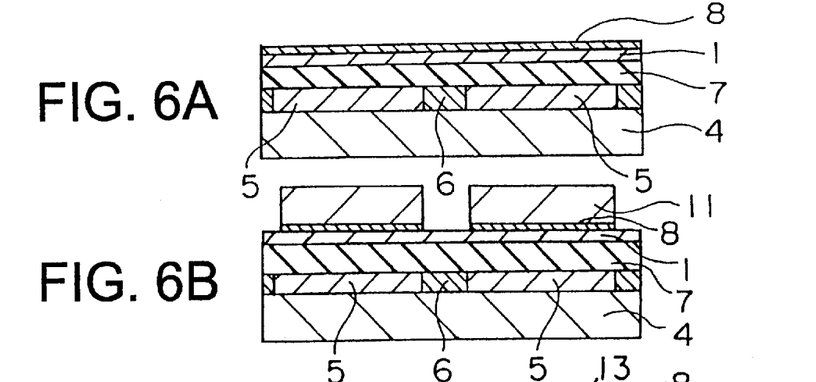
FIGS. 6A to 6D are cross-sectional diagrams showing the manufacturing process of the CCD type solid imaging device according to the second embodiment of the present invention.
Figure 6C:
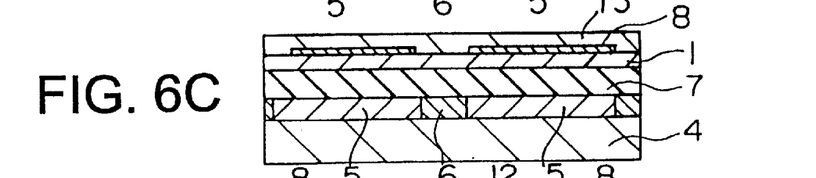
Figure 6D:
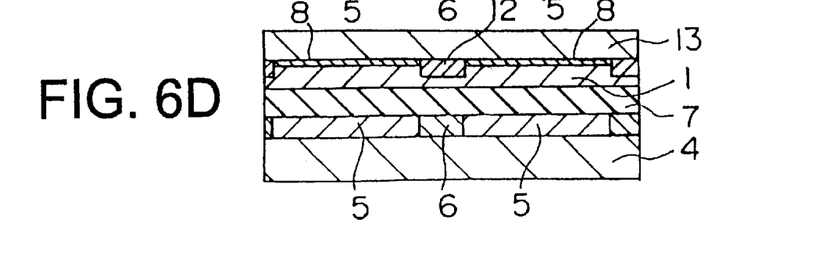

FIG. 5 is a cross-sectional diagram showing the frame transfer-type CCD-type solid imaging device according to the second embodiment of the present invention. FIGS. 6A to 6D are cross-sectional diagrams showing the manufacturing process of the CCD type solid imaging device according to the second embodiment of the present invention. Since the planar view and the cross-sectional view along the lateral direction of the transparent electrode are similar to those of the first embodiment, their illustrations are omitted. In FIGS. 5 and 6, the same components as those in FIGS. 2 and 4 are denoted by the same numerals.

In the CCD-type solid imaging device according to the second embodiment shown in FIG. 5, an N-type region 5 which constitutes the photoelectric conversion region 2 and a $P^+$-type region 6 which constitutes the channel stop region 6 are formed on the surface of the P-type silicon substrate 4. Furthermore, a transparent electrode 1 is formed on the substrate 4 through an insulating layer (the first insulating layer) made of, for example, a silicon oxide film.

The transparent electrode 1 is formed by the polycrystalline silicon, and a part of the polycrystalline silicon surface located above the channel stop region is converted into a silicide layer of the refractory metals, such as titanium silicide and tungsten silicide. This silicide layer forms a light shielding film for covering the channel stop region. The antireflection film is formed on the part of the transparent electrode which corresponds to the photoelectric conversion region. The flattening layer 9 (the second insulating layer) is formed so as to cover the antireflection film 8 and the light shielding film 12. In this embodiment, the same materials can be used as those used in the first embodiment.

An example of the manufacturing method of the above-described CCD-type solid imaging device is shown below with reference to FIGS. 6A to 6D.

As shown in FIG. 6A, an N-type region 5 and a $P^+$-type region 6 are formed on the P-type silicon substrate 4, and both regions 5 and 6 form the photoelectric conversion region 2 and the channel stop region 3, respectively. Subsequently, after a silicon oxide layer is formed over the entire surface as an insulating layer 7, a polycrystalline silicon film constituting the transparent electrode is formed at a thickness of 300 to 600Å. Subsequently, in order to form the antireflection film 8, a silicon nitride film, for example, is formed by means of CVD method or the like at a thickness of around 50 nm. It is preferable to form a thick polycrystalline silicon film from the point of view of lowering the resistance; however, if the polycrystalline silicon film is thicker than 800 nm, the side wall of the polycrystalline silicon may deteriorate. Therefore, the preferable thickness is in a range of 300 to 600 nm.

As shown in FIG. 6B, after a resist pattern 11 is formed on a part of the antireflection film (silicon nitride layer) corresponding to the photoelectric conversion region 2, the etching is carried out for removing the silicon nitride film excluding the area covered by the resist film 11. As a result, the antireflection film is formed only on an area covering the photoelectric conversion region 2, and the area outside the photoelectric conversion region 2 is covered by the exposed polycrystalline silicon as the transparent electrode 1.

After the resist pattern 11 is removed, a high melting point metal film 13 such as titanium or tungsten are formed at a thickness of around 50 nm, as shown in FIG. 6C.

As shown in FIG. 6D, heat-treatment at a temperature of 600° C. for around 30 minutes allows a silicide formation to take place at a portion where the polycrystalline silicon of transparent electrode is in direct contact with the high melting point metal film 13, and the light shielding film 12 comprising a high melting point metal silicide layer such as titanium silicide or the tungsten silicide is formed on the upper portion of the channel stop region.

Finally, the high melting point metal, which is not converted into silicide, is removed and the silicon oxide film forming the flattening layer 9 is formed. As a result, the CCD-type solid imaging device is obtained.

The CCD-type solid imaging device according to the second embodiment of the present invention also comprises the antireflection film 8 upon the photoelectric conversion region 2 on the transparent electrode 1 surface, the same effects as those of the first embodiment are obtained: the transmission of light to the photoelectric conversion region becomes high and high sensitivity of the device is improved.

In the solid imaging device of this embodiment, since the silicide layer is formed on a part of the transparent electrode above the channel stop region, the film thickness of the polycrystalline silicon above the channel stop region is thinner than that of the photoelectric conversion layer. However, since the specific resistance of the silicides such as titanium silicide or tungsten silicide are lower than that of the polycrystalline silicon, the silicide layer plays a role not only as the light shielding film 12, but also for compensating the increased resistance due to the reduced thickness of the transparent film 1 and for reducing the specific resistance per unit area. Consequently, the pulse rounding due to high wiring resistance can be prevented, and reduction of the transfer efficiency or the transfer charge quantity can be prevented.

The manufacturing process of this embodiment comprises the steps of, forming the antireflection film only on the photoelectric conversion region, depositing a high melting point metal over the entire surface, forming silicide at the position where the polycrystalline silicon of the transparent electrode 1 is in contact with the high melting point metal such that the light shielding film 12 is selectively formed on the channel stop region 3. The high melting point metal film on the area, where the silicide is not formed, is removed in the next process. Accordingly, this manufacturing process is reasonable in that the patterning process of the high melting point metalfilm 13 is not necessary.

It should be noted that the present invention is not limited to the two embodiments described hereinbefore, but variants thereof can be envisaged without passing beyond the scope of the invention. The solid imaging device of the present invention is suitable not-only for the frame transfer-type or q full-frame transfer-type solid imaging devices, but also for photoelectric conversion devices comprising photoelectric conversion portions such as CMOS-type or MOS-type solid imaging devices, and photocouplers. The features in the structure of the present invention are; (1) the antireflection film is formed on the photoelectric conversion region, (2) the thickness of the transparent electrode located above the photoelectric conversion region is thinner than that of the other area, (3) the light shielding film is formed over the entire surface excluding the photoelectric conversion region. The first embodiment shown above includes two features (1) and (2), and the second embodiment includes two features (1) and (3). The structure of the present solid imaging device is not limited to the above embodiments, and may include either one of those three features or may includes all of those three features.

In the above second embodiment, the light shielding film is formed by use of a silicide of a high melting point metal. However, the light shielding film can be formed by other metals. In this case, although it is not necessary to adopt heat treatment for silicide formation, it is necessary to remove a part of the metal film covering the photoelectric conversion region by the patterning or photolithographic process. In the manufacturing process according to the second embodiment, the light shielding film is formed after forming the antireflection film. However, it is possible to form the light shielding film first, and then form the antireflection film, if the light shielding film is formed by the patterning process.

In the above embodiments, the antireflection film is formed above all of the adjacent three transparent electrodes. When a method for driving the frame transfer-type CCD-type solid imaging device is adopted, it can be possible to use, for example, one N-type region under one transparent electrode as the photoelectric conversion region, and to use other N-type regions under two transparent electrodes as the charge transfer region. In such a case, the antireflection film can be coated only on the transparent electrode located above the photoelectric conversion region.

A variety of materials can be used besides specified materials described in the above embodiments. For example, a tantalum oxide film ($Ta_2O_5$) or BST ((Ba, Sr) $TaO_3$) can be used as the antireflection film, substituting to the silicon nitride or silicon oxynitride film.

What is claimed is:

1. A solid imaging device, which corresponds to a frame transfer-type or full-frame transfer-type solid imaging device, comprising:

a plurality of photoelectric conversion regions and a plurality of channel stop regions for separating each photoelectric conversion region are arranged on a semiconductor substrate; and transparent electrodes, which are formed overlying said plurality of photoelectric conversion regions and also overlying said plurality of channel stop regions formed through a first insulating film;

Wherein said solid imaging device further comprises an antireflection film formed on at least a part of said transparent electrodes located above said photoelectric conversion region.

2. A solid imaging device which corresponds to a frame transfer-type or full-frame transfer-type solid imaging device, comprising:

a plurality of photoelectric conversion regions and a plurality of channel stop regions for separating each photoelectric conversion region are arranged on a semiconductor substrate; and transparent electrodes, with an associated refractive index, formed on a first insulating film overlying said plurality of photoelectric conversion regions and also overlying said plurality of channel stop regions;

wherein, said solid imaging device comprises an antireflection film, having an associated refractive index, formed at an interface between at least a part of said transparent electrodes located above said photoelectric conversion region and a second insulating film, having an associated refractive index, covering said transparent film, wherein the refractive index associated with the antireflection film is in between the refractive indices of the transparent electrode and the second insulating film.

3. A solid imaging device according to claim 1, wherein a light shielding film is formed on said transparent electrodes excluding an area above said photoelectric conversion regions.

4. A solid imaging device according to claim 1, wherein the solid imaging device further comprises:

a light shielding film formed on the surface of said transparent electrode, excluding the surface above said photoelectric conversion region.

5. A solid imaging device which corresponds to a frame transfer-type or full-frame transfer-type solid imaging device, comprising:

a plurality of photoelectric conversion regions and a plurality of channel stop regions for separating each photoelectric conversion region arranged on a semiconductor substrate; and transparent electrodes formed on a first insulating film overlying said plurality of photoelectric conversion regions and also overlying said plurality of channel stop regions;

wherein a thickness of said transparent electrode above said photoelectric conversion region is formed so as to be thinner than that of said transparent electrode.

6. A solid imaging device comprising:

a semiconductor substrate;

a plurality of photoelectric conversion regions disposed on the semiconductor substrate;

a plurality of channel stop regions disposed on the semiconductor substrate between each photoelectric conversion region;

a first insulating film formed above the plurality of photoelectric conversion regions and the plurality of channel stop regions;

transparent electrodes formed on the first insulating film and overlying the plurality of photoelectric conversion regions and also overlying the plurality of channel stop regions; and an antireflection film formed on at least a part of the transparent electrodes that is located above the plurality of photoelectric conversion regions.

7. A solid imaging device comprising:
a semiconductor substrate;
a plurality of photoelectric conversion regions disposed on the semiconductor substrate;
a plurality of channel stop regions disposed on the semiconductor substrate between each photoelectric conversion region;
a first insulating film formed above the plurality of photoelectric conversion regions and the plurality of channel stop regions;
transparent electrodes, having an associated refractive index, formed on the first insulating film and overlying the plurality of photoelectric conversion regions and also overlying the plurality of channel stop regions;
an antireflection film, having an associated refractive index, formed on a part of the transparent electrodes located above the plurality of photoelectric conversion regions;
a second insulating film, having an associated refractive index, formed so as to cover the transparent electrodes and the antireflection film; and
wherein the refractive index of the- antireflection film is in between the refractive indices of the transparent electrodes and the second insulating film.

8. A solid imaging device according to claim 6, further comprising a light shielding film wherein the light shielding film is formed on an upper surface of the transparent electrodes overlying the plurality of channel stop regions.

9. A solid imaging device comprising:
a semiconductor substrate;
a plurality of photoelectric conversion regions disposed on the semiconductor substrate;
a plurality of channel stop regions disposed on the semiconductor substrate between each photoelectric conversion region;
a first insulating film formed above the plurality of photoelectric conversion regions and the plurality of channel stop regions;
transparent electrodes formed on the first insulating film and overlying the plurality of photoelectric conversion regions and also overlying the plurality of channel stop regions; and
a light shielding film formed on an upper surface of the transparent electrodes overlying said plurality of channel stop regions.

10. A solid imaging device comprising:
a semiconductor substrate;
a plurality of photoelectric conversion regions disposed on the semiconductor substrate;
a plurality of channel stop regions disposed on the semiconductor substrate between each photoelectric conversion region;
a first insulating film formed above the plurality of photoelectric conversion regions and the plurality of channel stop regions;
transparent electrodes formed on the first insulating film and overlying the plurality of photoelectric conversion regions and also overlying the plurality of channel stop regions; and
wherein a thickness of a part of the transparent electrodes overlying the plurality of photoelectric conversion regions is formed so as to be thinner than a part of said transparent electrodes not overlying the plurality of photoelectric conversion regions.

11. A solid imaging device, which corresponds to a frame transfer-type or full-frame transfer-type solid imaging device, comprising:
a plurality of photoelectric conversion regions and a plurality of channel stop regions for separating each photoelectric conversion region are arranged on a semiconductor substrate; and
transparent electrodes, which are formed overlying said plurality of photoelectric conversion regions and said plurality of channel stop regions formed through a first insulating film;
wherein said solid imaging device further comprises an antireflection film formed on at least a part of said transparent electrodes located above said photoelectric conversion region; and
wherein a thickness of a part of said transparent electrodes above said photoelectric conversion regions is formed so as to be thinner than that of the other areas of said transparent electrodes.

12. A solid imaging device comprising:
a semiconductor substrate;
a plurality of photoelectric conversion regions disposed on the semiconductor substrate;
a plurality of channel stop regions disposed on the semiconductor substrate between each photoelectric conversion region;
a first insulating film formed above the plurality of photoelectric conversion regions and the plurality of channel stop regions;
transparent electrodes formed on the first insulating film and overlying the plurality of photoelectric conversion regions and the plurality of channel stop regions;
an antireflection film formed on at least a part of the transparent electrodes that is located above the plurality of photoelectric conversion regions; and
wherein a thickness of a part of the transparent electrodes overlying the plurality of photoelectric conversion regions is formed so as to be thinner than a part of said transparent electrodes not overlying the plurality of photoelectric conversion regions.

13. A photoelectric conversion device comprising:
a first insulating film formed on a semiconductor substrate;
a transparent electrode formed on said first insulating film; and
an antireflection film formed on said transparent electrode.

14. A photoelectric conversion device according to claim 13, wherein a semiconductor region is formed so as to face said transparent electrode in the first region of said semiconductor substrate.

15. A photoelectric conversion device according to claim 13, wherein a desired voltage is applied to said transparent electrode.

16. A photoelectric conversion device according to claim 13, wherein a second insulating film is formed on said antireflection film.

17. A photoelectric conversion device according to claim 16, wherein a refractive index of said antireflection film is set at a refractive index which is between a refractive index of said transparent electrode and a refractive index of said second insulating film.

18. A photoelectric conversion device according to claim 14, wherein a plurality of first conduction type semiconductor regions are formed in said semiconductor region, and second conduction-type semiconductor regions are formed respectively interposed between mutually adjacent first conduction-type semiconductor regions.

19. A photoelectric conversion device according to claim 14, wherein said transparent electrode includes thin film regions facing said semiconductor region, and thick film regions not facing said semiconductor regions.

20. A photoelectric conversion device comprising:

a semiconductor substrate;

first semiconductor regions with a first conduction-type formed on said semiconductor substrate;

a first insulating film formed on said first semiconductor regions; and a transparent electrode formed on said first insulating film;

wherein, said transparent electrode comprises a thin film portion facing said semiconductor region and a thick film portion not facing said semiconductor region.

21. A photoelectric conversion device according to claim 20, wherein the photoelectric conversion device further comprises second semiconductor regions formed so as to be interposed between mutually adjacent first semiconductor regions.

22. A photoelectric conversion device according to claim 20, wherein the photoelectric conversion device further comprises an antireflection film formed on said thin film portion of said transparent electrode.

23. A photoelectric conversion device according to claim 22, wherein the photoelectric conversion device further comprises a second insulating film formed on said antireflection film.

24. A photoelectric conversion device according to claim 22, wherein a refractive index of said antireflection film is set between a refractive index of said transparent electrode and a refractive index of said second insulating film.

* * * * *